(12) United States Patent
Sogo et al.

(10) Patent No.: US 6,534,829 B2
(45) Date of Patent: *Mar. 18, 2003

(54) SEMICONDUCTOR DEVICE AND METHOD FOR FABRICATING THE SAME

(75) Inventors: Seiji Sogo, Kyoto (JP); Yuji Ueno, Shiga (JP); Seiki Yamaguchi, Shiga (JP); Yoshihiro Mori, Kyoto (JP); Yoshiaki Hachiya, Shiga (JP); Satoru Takahashi, Kyoto (JP); Yuji Yamanishi, Osaka (JP); Ryuma Hirano, Kyoto (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,709

(22) Filed: May 28, 1999

(65) Prior Publication Data

US 2002/0027244 A1 Mar. 7, 2002

(30) Foreign Application Priority Data

Jun. 25, 1998 (JP) ............................................. 10-178612
Apr. 19, 1999 (JP) ............................................. 11-110416

(51) Int. Cl.$^7$ ......................... H01L 27/01; H01L 27/12; H01L 31/0392; H01L 23/58; H01L 29/00

(52) U.S. Cl. ..................... 257/343; 257/409; 257/491; 257/544

(58) Field of Search ................................ 257/343, 409, 257/491, 544

(56) References Cited

U.S. PATENT DOCUMENTS

| | | | | |
|---|---|---|---|---|
| 4,628,341 A | * | 12/1986 | Thomas | ........................ 357/42 |
| 4,811,075 A | | 3/1989 | Eklund | |
| 5,146,298 A | | 9/1992 | Eklund | |

(List continued on next page.)

FOREIGN PATENT DOCUMENTS

| | | | | |
|---|---|---|---|---|
| JP | 52117586 | 10/1977 | | |
| JP | 1127261 | 8/1989 | | |
| JP | 4-107867 | 4/1992 | | |
| JP | 4107870 | 4/1992 | | |
| JP | 4-107877 | 4/1992 | | |
| JP | 4-107878 | * | 4/1992 | ................. 257/409 |
| JP | 4241463 | 8/1992 | | |
| JP | 07038097 | 2/1995 | | |
| JP | 1084111 | 3/1998 | | |
| WO | WO 98/20562 | 5/1998 | | |

*Primary Examiner*—Long Pham
*Assistant Examiner*—Shrinivas H. Rao
(74) *Attorney, Agent, or Firm*—Nixon Peabody LLP; Donald R. Studebaker

(57) ABSTRACT

The semiconductor device of the present invention includes: a semiconductor layer of a first conductivity type; source and drain regions of a second conductivity type, which are formed within the semiconductor layer; a channel region provided between the source and drain regions; and a gate electrode formed over the channel region. The device further includes: a buried region of the first conductivity type, at least part of the buried region being included in the drain region; and a heavily doped region of the second conductivity type. The heavily doped region is provided at least between a surface of the semiconductor layer and the buried region. The concentration of a dopant of the second conductivity type in the heavily doped region is higher than that of the dopant of the second conductivity type in the drain region.

30 Claims, 14 Drawing Sheets

U.S. PATENT DOCUMENTS

| | | | | |
|---|---|---|---|---|
| 5,294,824 A | * | 3/1994 | Okada | 257/409 |
| 5,313,082 A | | 5/1994 | Eklund | |
| 5,374,843 A | * | 12/1994 | Williams et al. | 257/492 |
| 5,386,136 A | * | 1/1995 | Williams et al. | 257/409 |
| 5,448,101 A | * | 9/1995 | Ono et al. | 257/491 |
| 5,485,027 A | * | 1/1996 | Williams et al. | 257/343 |
| 5,523,601 A | * | 6/1996 | Yanagigawa | 257/339 |
| 5,541,125 A | * | 7/1996 | Williams et al. | 437/34 |
| 5,578,509 A | * | 11/1996 | Fujita | 437/35 |
| 6,049,117 A | * | 4/2000 | Fukunaga et al. | 257/446 |

* cited by examiner

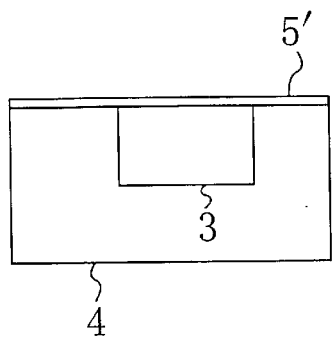
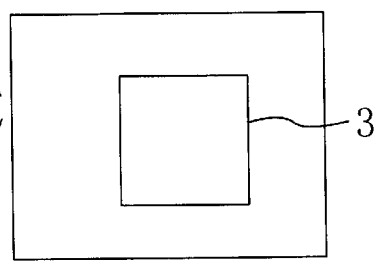
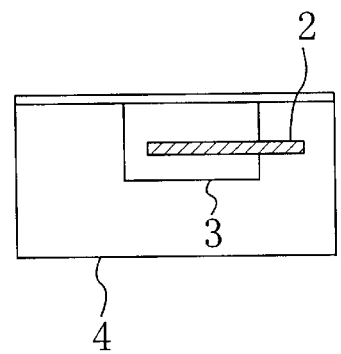
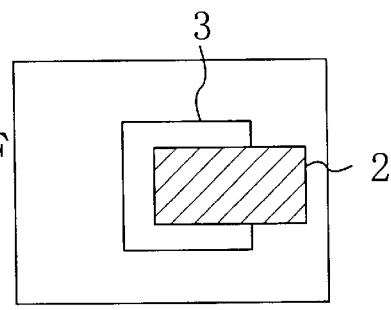
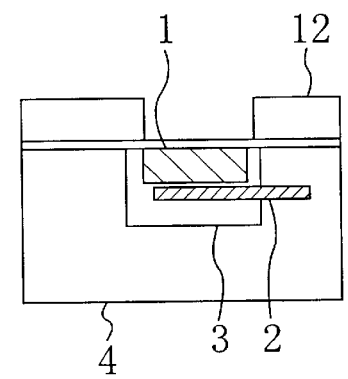
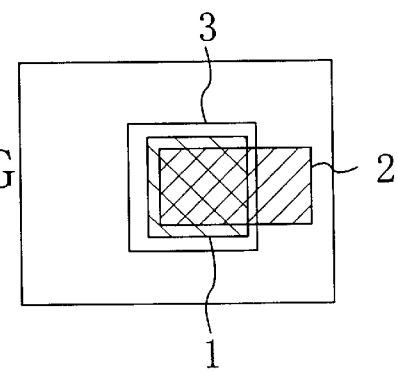
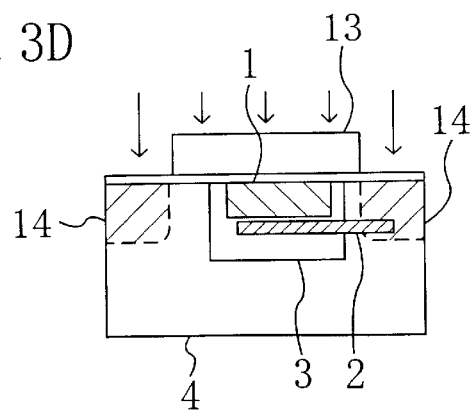
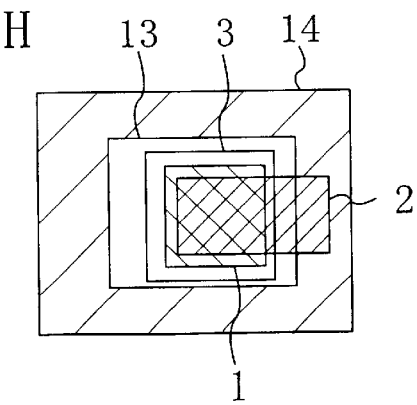

L′w ≧ Tw

SEMICONDUCTOR DEVICE AND METHOD FOR FABRICATING THE SAME

BACKGROUND OF THE INVENTION

The present invention generally relates to a semiconductor device and a method for fabricating the same, and more particularly relates to a power MOSFET with a reduced ON-state resistance but with an increased drain-source breakdown voltage and to a method for fabricating the same.

First, a conventional semiconductor device with a structure for increasing a drain-source breakdown voltage will be described with reference to FIG. 8. This semiconductor device is described in Japanese Laid-Open Publication No. 4-107877, which was filed by Matsushita Electronics Corporation.

This device includes: an n-type source region 107 and an n-type extended drain region 103, which are both formed within a p-type single crystalline silicon substrate 104; and a p-type buried region 102 enclosed in the n-type extended drain region 103. In part of the n-type extended drain region 103, a drain contact region 114 is provided to be in electrically contact with a drain electrode 110. The n-type source region 107, as well as a substrate contact region 108 formed within the surface of the p-type single crystalline substrate 104, is in electrically contact with a source electrode 111. And an anti-punchthrough region 109 is provided to surround the source region 107 and the substrate contact region 108.

A region between the source region 107 and the extended drain region 103 functions as a channel region. A gate electrode 106 is provided over the surface of the p-type silicon substrate 104 with a gate insulating film interposed therebetween. And the surface of the substrate 104 is covered with a thermal oxide film 105.

This semiconductor device is characterized by including: the n-type extended drain region 103, which is formed by a diffusion process within the p-type substrate 104 to have a relatively low dopant concentration; and the p-type buried region 102 formed inside the n-type extended drain region 103.

FIG. 9 illustrates the distributions of dopant concentrations and the distribution of a carrier concentration in the depth direction, which are both measured along the line X–X' in FIG. 8. In general, the conductivity type of a particular semiconductor region is determined as p- or n-type depending on the result of comparison in concentration between p- and n-type dopants existing in the particular semiconductor region. That is to say, if the concentration of the p-type dopant is higher in that region than that of the n-type dopant, then the conductivity type of the semiconductor region is p-type, and vice versa. It should be noted that the higher the concentration of an n-type dopant, the lower the ON-state resistance of a MOSFET.

Next, the ON- and OFF-state operations of this semiconductor device will be described.

The p-type buried region 102 is reverse-biased relative to the extended drain region 103. Accordingly, while this MOSFET is in its OFF state, a depletion layer expands not only from a pn junction between the p-type buried region 102 and the n-type extended drain region 103, but also from a pn junction between the p-type substrate 104 and the n-type extended drain region 103. By utilizing these depletion layers, the breakdown voltage of this MOSFET can be increased.

On the other hand, while the MOSFET is in its ON state, electrons are moving through the extended drain region. More specifically, the electrons are moving through part of the extended drain region 103 near the surface of the substrate 104, where the concentration of the n-type dopant is the highest, and through another part of the extended drain region 103 under the p-type buried region 102. However, if the p-type buried region 102 has been formed by an ordinary diffusion process, then the conductivity type of the surface region of the substrate 104, where the concentration of the n-type dopant is usually the highest, is inverted into p-type. As a result, the concentration of n-type carriers decreases and the ON-state resistance increases in that region. Thus, this structure can decrease the ON-state resistance of the MOSFET with the breakdown voltage thereof increased.

The method disclosed in Japanese Laid-Open Publication No. 4-107877 includes the steps of: forming the extended drain region 103 by implanting dopant ions into the p-type substrate 104 and diffusing the dopant through the substrate 104; implanting boron ions into the extended drain region 103 and then conducting a heat treatment; and thermally oxidizing the surface of the substrate 104. As a result of the final thermal oxidation process step, the concentration of the p-type dopant in the region between the p-type buried region 102 and the surface of the substrate 104 decreases, thus inverting the conductivity type of that region into n-type. During this thermal oxidation process step, the boron ions, existing in the region above the p-type buried region 102, are introduced into the silicon dioxide film 105 by utilizing the difference in coefficient of segregation between silicon and silicon dioxide. As a result of this thermal oxidation, the p-type buried region 102 is located at a distance from the surface of the substrate with the thin n-type region interposed therebetween. That is to say, the p-type buried region 102 is embedded in the extended drain region 103 so to speak. However, in order to invert the conductivity type of the region above the p-type buried region 102 into n-type by decreasing the concentration of boron in that region, a thermal oxide film with a relatively large thickness (e.g., 1 μm or more) should be formed thereon.

In this conventional method, the depth of the p-type buried region 102 from the surface of the substrate and the control over the carrier concentration in the region between the p-type buried region 102 and the surface of the substrate are both dependent on the conditions under which the thermal oxide film 105 is formed. Accordingly, the carrier concentration in that surface region of the extended drain region 103 is affected by a variation in process parameters, including temperature and flow rate of oxygen gas, during the process step of forming the thermal oxide film 105. More specifically, the surface carrier concentration in the extended drain region 103 is very sensitive to, or greatly variable with, a rate at which the thermal oxide film 105 is formed and with the final thickness of the thermal oxide film 105. Accordingly, it is extremely difficult to precisely control the surface carrier concentration of the extended drain region 103 during the thermal oxidation process step.

As shown in FIG. 9, in the surface region of the semiconductor substrate, the concentration of the p-type carriers is only slightly different from that of the n-type carriers. The difference is so small that this delicate concentration balance is easily disturbed by various factors during the fabrication process. For example, if the concentration of the p-type carriers does not sufficiently decrease in that surface region during the formation of the p-type buried region 102, then the conductivity type at the surface of the p-type diffusion layer might be not completely inverted into n-type. Or even if the conductivity type has been successfully inverted into n-type, the concentration of the p-type carriers in the surface region may be greatly variable every time the p-type buried region 102 is formed. Such inconsistent inversion or greatly variable concentration is likely to broaden the variation range of the ON-state resistance (e.g., 1.2 to 2.0 Ω per unit area) depending on the current passing through the extended drain region between the gate and drain electrodes, or considerably varies the characteristics of the device.

To reduce this variation, a method shown in FIGS. 10A and 10B may be employed. In the illustrated method, an extended drain region 26 is first formed within a p-type substrate 27, and then boron ions are implanted into the substrate 27 with a relatively high implant energy of 1 to 2 MeV. Specifically, according to this method, a thick resist film 24 with a relatively large thickness of about 3 to about 4 μm is applied onto the surface of the p-type substrate 27 and then exposed to radiation and developed by photolithography to form an opening in the resist film 24. Thereafter, boron ions are implanted with high energy into the substrate 27 through this opening so as to reach a depth of about 1 μm as measured from the surface of the extended drain region 26. As a result, a p-type buried region 28 is formed as shown in FIG. 10B. In accordance with this method, the uniformity of surface concentration in the extended drain region 26 is dependent on how the extended drain region 26 itself is formed. Thus, unlike the prior art described above, the process step of inverting the conductivity type of the p-type surface region into n-type by introducing boron ions into the oxide film 105 is no longer necessary. Consequently, the variation in ON-state resistance of the MOSFET can be reduced.

In order to form the p-type buried region 28 by such high-energy ion implantation, a patterned ion implantation mask such as resist film, metal film or insulating film should be formed on the substrate. Also, each edge of the patterned ion implantation mask is not completely parallel to the direction in which the ions are implanted. Accordingly, in the surface region of the substrate below the edge of the ion implantation mask, the profile of the dopant, which has been implanted into the substrate by the high-energy implantation technique, shifts toward the surface of the substrate. Also, to ensure sufficient blocking effect by the use of the ion implantation mask, the higher the implant energy is, the thicker the mask such as a resist film should be. In addition, to maintain a certain degree of vacuum within an ion implanter, the solvent, water and the like contained in a resist film should be vaporized by heating the semiconductor substrate in advance. However, if the resist film is thick, then the substrate should be heated for a longer time or at a higher temperature than usual. Nevertheless, if the substrate is heated under such a condition, then the edge of the thick resist film 24 is likely to incline and the resist film 24 is likely to have a trapezoidal cross section as shown in FIG. 10B. This is because the deformation of the thick resist film 24 usually results from the shrinkage of part of the resist film 24 that is not in contact with the substrate 27 rather than the other part of the resist film 24 in contact with the substrate 27. If the ions are implanted using such a deformed resist film 24 as a mask, then the thinned part of the resist film 24 at the edge thereof cannot perform the expected masking effect, or cannot sufficiently block the impinging ions. As a result, the dopant ions pass through that part of the resist film 24 to be implanted into a region of the substrate near the surface thereof as shown in FIG. 10B. That is to say, the outer periphery of the buried region 28 protrudes upward, i.e., toward the surface of the substrate, thereby forming a p-type region reaching the surface of the substrate. Such a p-type region, reaching the surface of the substrate, is formed to cross the path of a drain current between the gate region and the drain electrode, thus increasing the ON-state resistance of the device.

SUMMARY OF THE INVENTION

An object of the present invention is providing a semiconductor device with an increased- drain-source breakdown voltage and yet with a reduced ON-state resistance.

A semiconductor device according to the present invention includes: a semiconductor layer of a first conductivity type; a source region of a second conductivity type, the source region being formed within the semiconductor layer; a drain region of the second conductivity type, the drain region being formed within the semiconductor layer; a channel region provided between the source and drain regions; and a gate electrode formed over the channel region. The device further includes: a buried region of the first conductivity type, at least part of the buried region being included in the drain region; and a heavily doped region of the second conductivity type. The heavily doped region is provided at least between a surface of the semiconductor layer and the buried region. The concentration of a dopant of the second conductivity type in the heavily doped region is higher than that of the dopant of the second conductivity type in the drain region.

A method according to the present invention is a method for fabricating a semiconductor device including: a semiconductor layer of a first conductivity type; a source region of a second conductivity type, the source region being formed within the semiconductor layer; a drain region of the second conductivity type, the drain region being formed within the semiconductor layer; a channel region provided between the source and drain regions; a gate electrode formed over the channel region; and a buried region of the first conductivity type, at least part of the buried region being included in the drain region. The method includes the steps of: doping the semiconductor layer with a dopant of the second conductivity type for the drain region; doping the semiconductor layer with a dopant of the first conductivity type for the buried region; and forming a heavily doped region of the second conductivity type at least between the surface of the semiconductor layer and the buried region by further doping the semiconductor layer with the dopant of the second conductivity type.

Another semiconductor device according to the present invention includes: a semiconductor layer of a first conductivity type; a source region of a second conductivity type, the source region being formed within the semiconductor layer; a drain region of the second conductivity type, the drain region being formed within the semiconductor layer; a channel region provided between the source and drain regions; and a gate electrode formed over the channel region. The device further includes a buried region of the first conductivity type. At least part of the buried region is included in the drain region. The buried region is divided into a plurality of parts. A gap region for making a drain current flow therethrough exists between adjacent ones of the divided parts of the buried region.

Another method according to the present invention is a method for fabricating a semiconductor device including: a semiconductor layer of a first conductivity type; a source region of a second conductivity type, the source region being formed within the semiconductor layer; a drain region of the second conductivity type, the drain region being formed within the semiconductor layer; a channel region provided between the source and drain regions; a gate electrode formed over the channel region; and a buried region of the first conductivity type, at least part of the buried region being included in the drain region. The method includes the steps of: doping the semiconductor layer with a dopant of the second conductivity type for the drain region; and doping the semiconductor layer with a dopant of the first conductivity type for the buried region, thereby forming the buried region divided into a plurality of parts.

BRIEF DESCRIPTION OF THE DRAWINGS

FIGS. 3A, 3B, 3C and 3D are cross-sectional views illustrating principal process steps of a first exemplary method for fabricating a semiconductor device according to the present invention; and FIGS. 3E, 3F, 3G and 3H are plan views illustrating planar layouts corresponding to the respective process steps shown in FIGS. 3A, 3B, 3C and 3D.

DESCRIPTION OF THE PREFERRED EMBODIMENTS

EMBODIMENT 1

Figure 1A:
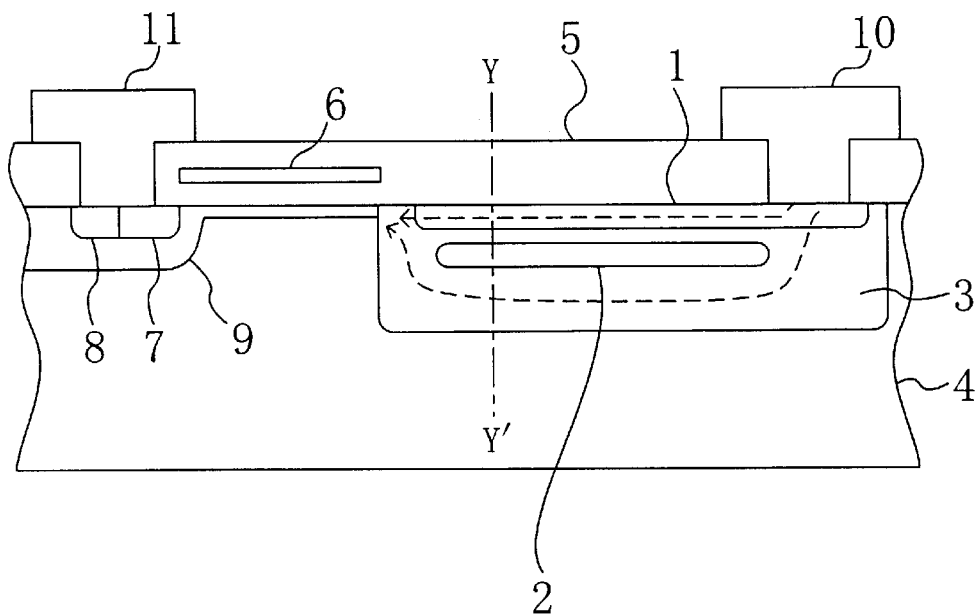
FIG. 1A is a cross-sectional view illustrating a first exemplary embodiment of a semiconductor device according to the present invention.
Figure 1B:
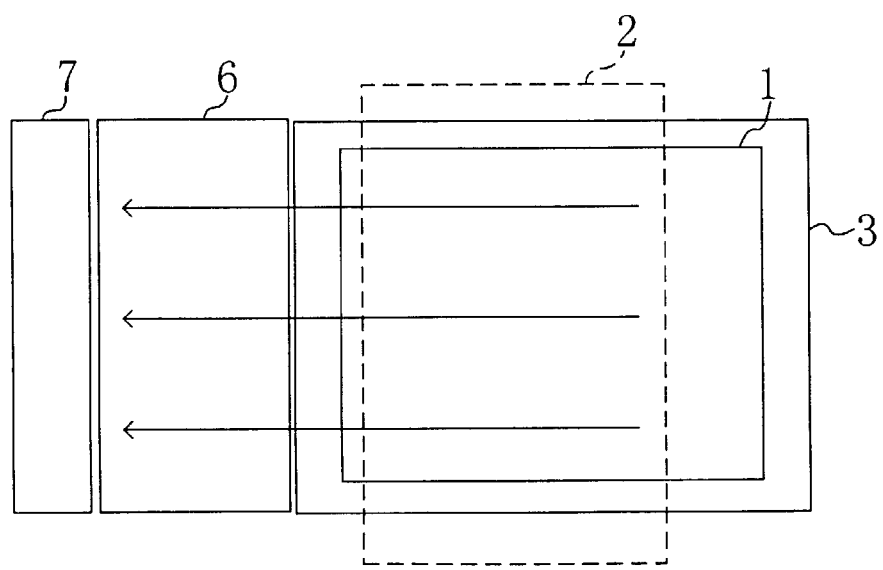
FIG. 1B is a plan view illustrating a planar layout thereof.

Hereinafter, a first exemplary embodiment of a semiconductor device according to the present invention will be described with reference to FIGS. 1A and 1B. FIG. 1A illustrates a cross-sectional structure of a semiconductor device of this embodiment; and FIG. 1B illustrates a planar layout for several components of the semiconductor device.

This semiconductor device has a lateral MOSFET structure formed in a p-type single crystalline silicon substrate 4 with the concentration of a p-type dopant defined within the range from about $1 \times 10^{14}$ cm$^{-3}$ to about $3 \times 10^{14}$ cm$^{-3}$. More specifically, the semiconductor device includes: n-type source region 7 and n-type extended drain region (may also be called simply "drain region") 3, which are formed within the p-type silicon substrate 4; and a p-type buried region 2 substantially surrounded by the n-type extended drain region 3. In this embodiment, the n-type source region 7 is placed adjacent to a p-type substrate contact region 8 formed within the surface of the p-type single crystalline silicon substrate 4. The n-type source region 7 and the p-type substrate contact region 8 are both in contact with a source electrode 11. As shown in FIG. 1B, the p-type buried region 2 may be extended outward from the edges of the n-type extended drain region 3 to be electrically connected to the p-type substrate 4. It should be noted that the electrical connection between the p-type buried region 2 and the p-type substrate 4 is not limited to that exemplified in FIG. 1B. Alternatively, at least part of the p-type buried region 2 may extend outward (i.e., inside the substrate 4) from the n-type extended drain region 3. However, it is not preferable for the p-type buried region 2 to extend toward the channel region.

In this embodiment, the surface concentration of an n-type dopant in the n-type extended drain region 3 is defined within the range from about $1 \times 10^{16}$ cm$^{-3}$ to about $1 \times 10^{17}$ cm$^{-3}$. The thickness of the n-type extended drain region 3 is in the range from about 6 μm to about 7 μm. The p-type buried region 2 is formed at a depth of about 1 μm to about 1.5 μm within the silicon substrate 4 as measured from the surface thereof. The thickness of the p-type buried region 2 is in the range from about 0.8 μm to about 1.2 μm.

This semiconductor device is characterized by further including an n-type heavily doped region (thickness: from about 0.5 μm to about 1 μm) 1 between the surface of the p-type silicon substrate 4 and the p-type buried region 2. So long as the n-type heavily doped region 1 is located above the p-type buried region 2, the n-type heavily doped region 1 may be either separated from the p-type buried region 2 as shown in FIG. 1A or in contact with the p-type buried region 2. In this embodiment, to define the sheet resistance of the n-type heavily doped region 1 within the range from about 0.8 Ω/□ to about 1.0 Ω/□, the doping level of the n-type dopant is adjusted such that the surface concentration of the n-type dopant falls within the range from $1\times10^{17}$ cm$^{-3}$ to about $1\times10^{18}$ cm$^{-3}$. The surface concentration of the n-type dopant in the n-type heavily doped region 1 is appropriately determined depending on the ON-state resistance required for a MOSFET to operate properly. To reduce the ON-state resistance, the surface concentration of the n-type dopant in the n-type heavily doped region 1 is preferably high and the n-type heavily doped region 1 should be thick.

The region between the source region 7 and the extended drain region 3 functions as a channel region. The source region 7 and the substrate contact region 8 are formed in an anti-punchthrough region 9 lightly doped with a p-type dopant. A gate electrode 6 is formed over the channel region of the p-type silicon substrate 4 with a gate insulating film interposed therebetween. An insulating film (thickness: from about 1 μm to about 2 μm) 5 is formed over the semiconductor substrate 4 to cover the gate electrode 6.

The n-type heavily doped region 1 shown in FIGS. 1A and 1B covers an area from above one side through the other of the buried region 2 in the direction in which the extended drain region 3 extends. In other words, the n-type heavily doped region 1 expands over the right- and left-hand edges of the buried region 2 shown in FIG. 1A outward, or right- and leftward. In this embodiment, part of the n-type heavily doped region 1 is directly in contact with the drain electrode 10. Thus, no drain contact region is formed for that purpose. Even so, if the n-type heavily doped region 1 has a dopant concentration approximately equal to that of an ordinary drain contact region, a sufficiently low contact resistance is attained.

While the MOSFET is in the ON state, the current flows through the n-type heavily doped region 1 and the extended drain region 3 toward the source region 7 as indicated by the dashed arrows in FIG. 1A and the solid ones in FIG. 1B.

Figure 2:
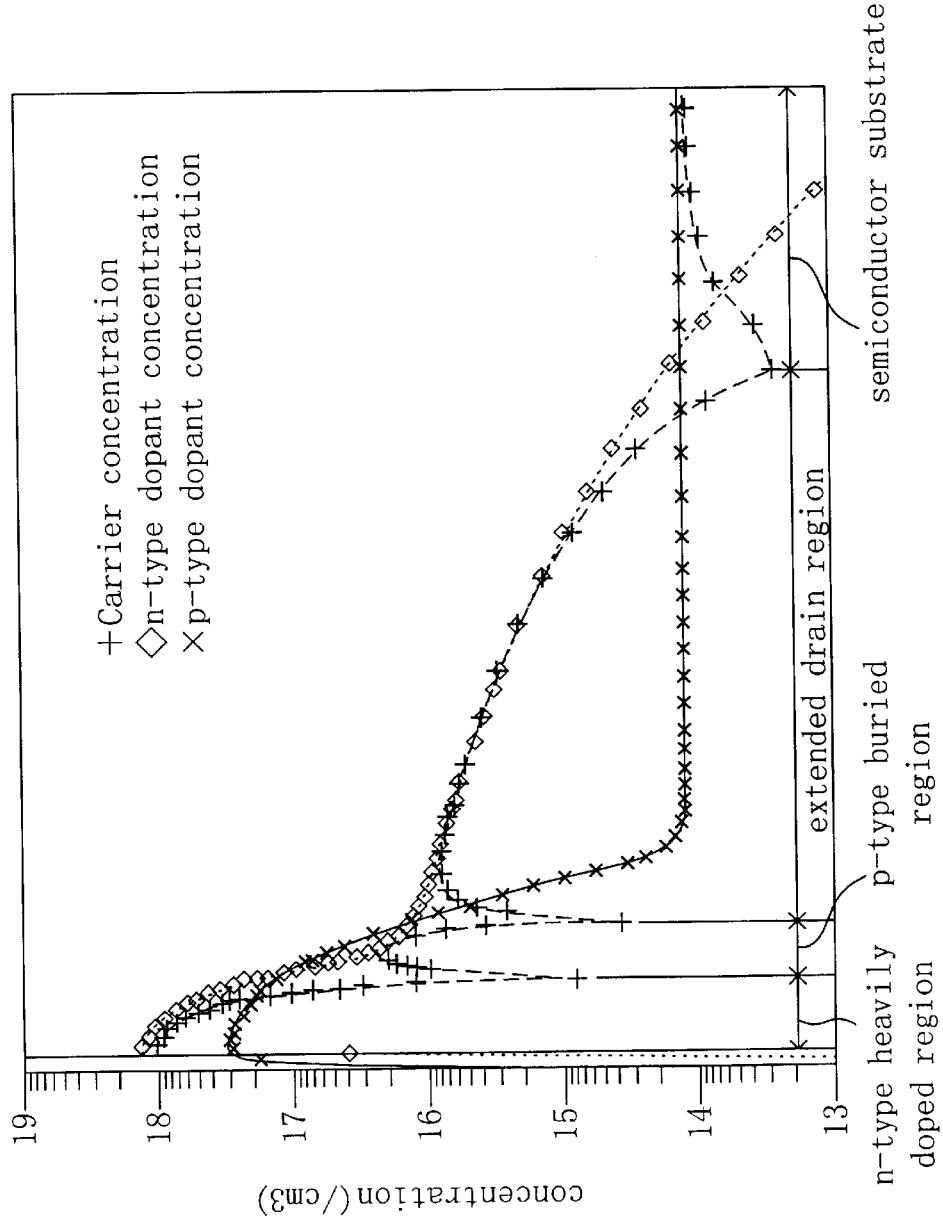
FIG. 2 is a graph illustrating profiles of respective dopants as measured in the depth direction along the line Y–Y' in FIG. 1.

FIG. 2 illustrates profiles of respective dopants as measured in the depth direction along the line Y–Y' in FIG. 1. As can be seen from FIG. 2, the concentration of the n-type dopant in the heavily doped region 1 formed between the surface of the substrate 4 and the buried region 2 is higher than that of the n-type dopant in the conventional extended drain region (see FIG. 9). Accordingly, the existence of the n-type heavily doped region 1 can reduce the ON-state resistance of the MOSFET. Also, the concentration of the n-type dopant in the upper part (i.e., closer to the surface of the substrate) of the extended drain region 3 is much higher than that of the p-type dopant in that part. Thus, the ON-state resistance of the transistor neither increases nor greatly changes due to the variation of parameters during the fabrication process thereof.

Figure 8:
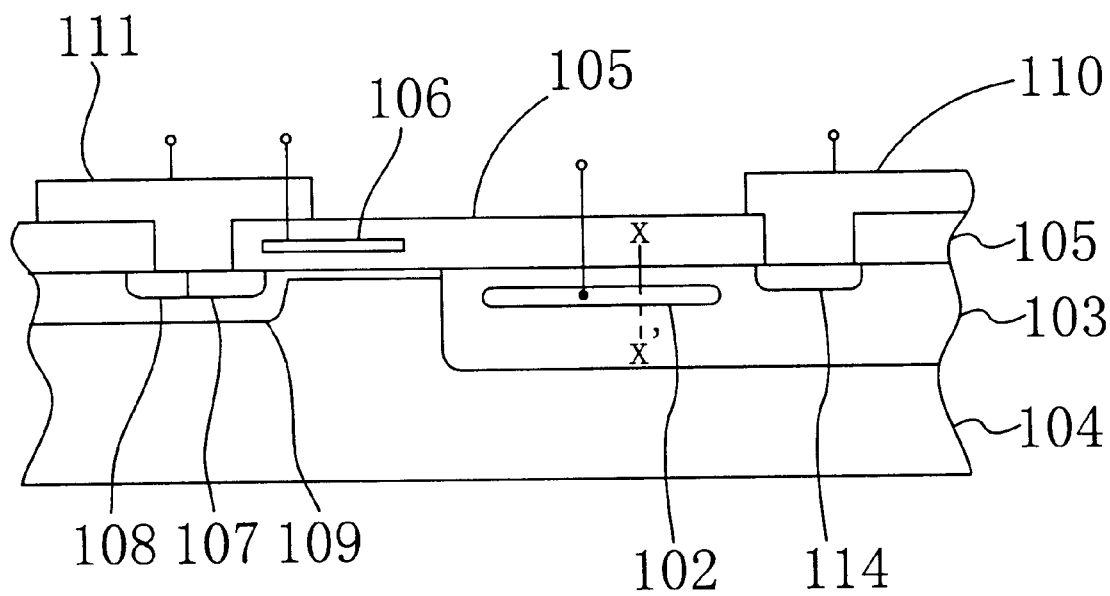
FIG. 8 is a cross-sectional view of a conventional semiconductor device including a buried region within an extended drain region thereof.

If the p-type buried region is formed inside the n-type extended drain region 3, n- and p-type dopants both exist between the buried region and the surface of the semiconductor substrate. In the conventional semiconductor device shown in FIG. 8, an inversion layer might be formed in the upper part of the n-type extended drain region 3 to disrupt the path of drain current. In contrast, in the device of this embodiment, the n-type heavily doped region specially provided can greatly reduce the resistance as compared with the conventional structure.

Hereinafter, an exemplary method for fabricating the semiconductor device according to the present invention will be described with reference to FIGS. 3A, 3B, 3C, 3D, 3E, 3F, 3G and 3H. FIGS. 3A, 3B, 3C and 3D illustrate respective cross sections of the device at principal steps of the fabrication process. FIGS. 3E, 3F, 3G and 3H illustrate planar layouts of the device corresponding to the respective process steps shown in FIGS. 3A, 3B, 3C and 3D.

First, as shown in FIGS. 3A and 3E, the n-type extended drain region 3 is formed within the p-type semiconductor of substrate 4. The extended drain region 3 may be formed by an ordinary thermal diffusion process. In this process step, the surface of the semiconductor substrate 4 is covered with an insulating film 5'.

Next, as shown in FIGS. 3B and 3F, the p-type buried region 2 is formed within the p-type semiconductor substrate 4 by a high-energy ion implantation technique. Most of the p-type buried region 2 is covered with the extended drain region 3, but one end of the p-type buried region 2 extends outward from the extended drain region 3 to come into electrical contact with the p-type semiconductor substrate 4. Unlike the arrangement shown in FIGS. 1A and 1B, one end of the p-type buried region 2 protrudes in this embodiment in the opposite direction to the flow of the drain current.

Figure 9:
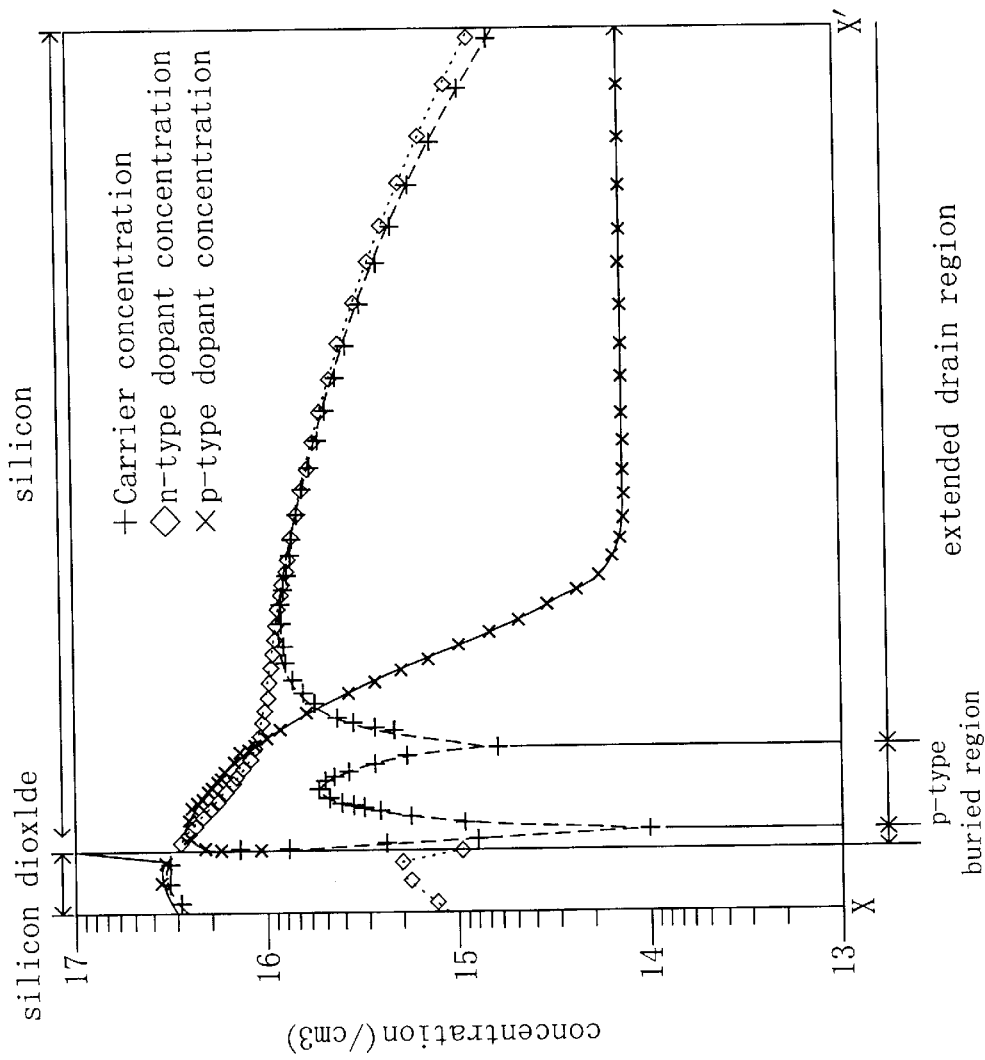
FIG. 9 is a graph illustrating profiles of respective dopants as measured in the depth direction along the line X–X' in FIG. 8.
Figure 10A:
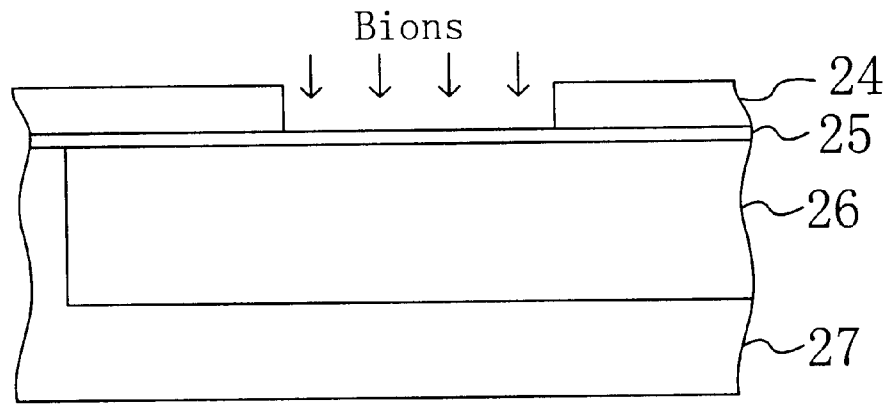
FIGS. 10A and 10B are cross-sectional views illustrating respective process steps for forming a p-type buried region by a high-energy ion implantation technique.
Figure 10B:
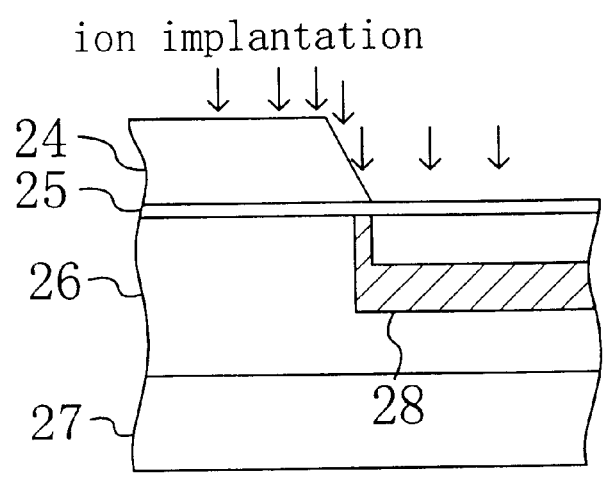

Subsequently, as shown in FIGS. 3C and 3G, the surface of the p-type semiconductor substrate 4 is partially covered with a resist mask 12 and then n-type dopant ions are implanted into the p-type semiconductor substrate 4 to form the n-type heavily doped region 1. When the heavily doped region 1 is formed by a doping technique as is done in this embodiment, the dopant concentration and the thickness of the heavily doped region 1 can be designed very flexibly. In the semiconductor device shown in FIG. 8, the thickness of the n-type layer between the surface of the semiconductor substrate and the buried region is smaller than 0.5 μm as shown in FIG. 9. In accordance with the conventional method for fabricating the device shown in FIG. 8, it is difficult to increase the thickness of this n-type layer up to 0.5 μm or more. Thus, the resistance in the surface region of the extended drain region cannot be sufficiently reduced. In contrast, according to the method of this embodiment, the resistance in the surface region can be reduced easily.

Thereafter, as shown in FIGS. 3D and 3H, the surface of the p-type semiconductor substrate 4 is partially covered with a resist mask 13 and then p-type dopant ions are implanted into the p-type semiconductor substrate 4 at a dose of $1\times10^{15}$ cm$^{-2}$ and with an implant energy of 100 keV, thereby forming channel stop regions (including anti-punchthrough regions) 14. One end of the p-type buried region 2 is connected to the channel stop region 14. Since the dopant concentration in the p-type buried region 2 is set relatively low to increase the breakdown voltage of the device, the contact resistance between the p-type buried region 2 and the p-type semiconductor substrate 4 becomes relatively high. Accordingly, by setting the dopant concentration in the channel stop regions 14 relatively high, the contact resistance between the p-type buried region 2 and the channel stop regions 14 is reduced. As a result, the substrate potential can be supplied efficiently to the p-type buried region 2 through the channel stop regions 14 during the operation of the device. In order to reduce the electrical connection resistance of the device, the concentration of the p-type dopant in the channel stop regions 14 is preferably higher than that in the p-type buried region 2.

Figure 4:
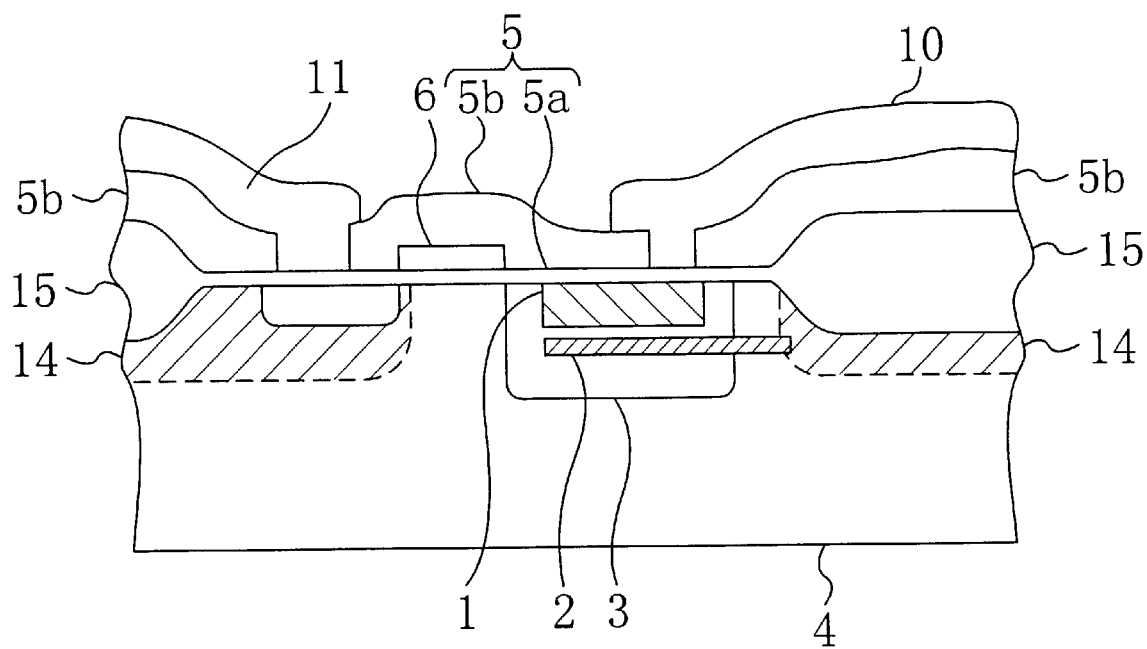
FIG. 4 is a cross-sectional view of a semiconductor device fabricated by the method of the present invention.

The semiconductor device shown in FIG. 4 is obtained by performing known process steps for fabricating a semiconductor device after the channel stop regions 14 have been formed. The device shown in FIG. 4 includes LOCOS regions 15 as a field oxide. In the example shown in FIG. 4, the LOCOS regions 15 are included within the channel stop regions 14. Alternatively, the LOCOS regions 15 may or may not cover the extended drain region 3. Source 7, channel and substrate contact regions are formed in respective parts of the channel stop regions 14 that are not occupied by the LOCOS regions 15. In this embodiment, part of the heavily doped region 1 functions as an alternate substrate contact region. Also, part of the channel stop region 14 that surrounds the source region 7 functions as the anti-punchthrough region (i.e., the region 9 shown in FIG. 1A). The gate electrode 6 is formed on a gate insulating film 5a and is covered with an interlevel dielectric film 5b. Drain and source electrodes 10 and 11 are formed on the interlevel dielectric film 5b.

FIGS. 5A, 5B, 5C and 5D illustrate exemplary planar layouts for principal components of the semiconductor device according to the present invention. In these drawings, exemplary positional relationships among the n-type heavily doped region 1, p-type buried region 2, extended drain region 3 and gate electrode 6 are illustrated, and the arrows indicate respective current paths. In the area where the buried region 2 is formed, the thickness of the extended drain region 3 is the sum of thicknesses of respective parts of the extended drain region 3 over and under the buried region 2 (see FIG. 1A). Accordingly, the extended drain region 3 is relatively thick in the area where the buried region 2 is not formed, but relatively thin in the area where the buried region 2 is formed. That is to say, since the thickness of the extended drain region 3 at a position is different that at another position, the sheet resistance of the extended drain region 3 is also variable within this region. In general, current is more likely to flow through a region where the sheet resistance is low. Accordingly, the current is going to flow through the n-type heavily doped region 1 before anywhere else as indicated by the arrows in FIGS. 5A through 5D.

Figure 5A:
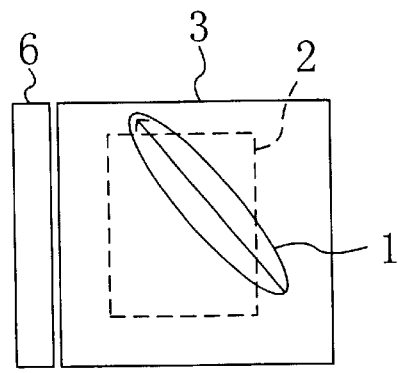
FIGS. 5A, 5B, 5C and 5D are plan views illustrating exemplary layouts for principal components of the semiconductor device according to the present invention.

In FIG. 5A, the n-type heavily doped region 1 extends from part of the extended drain region 3 where the p-type buried region 2 does not exist and obliquely crosses over part of the buried region 2 to reach another part of the extended drain region 3 where the buried region 2 does not exist. In other words, the n-type heavily doped region 1 passes through part of the extended drain region 3 with an increased sheet resistance due to the existence of the buried region 2 to interconnect other parts of the extended drain region 3 with a relatively low sheet resistance. Accordingly, even if the density of n-type carriers has decreased between the surface of the substrate and the p-type buried region 2 due to the existence of the p-type carriers doped to form the p-type buried region 2, the increase in ON-state resistance can be suppressed. This is because the n-type heavily doped region 1 provides a current path with a low resistance.

Figure 5B:
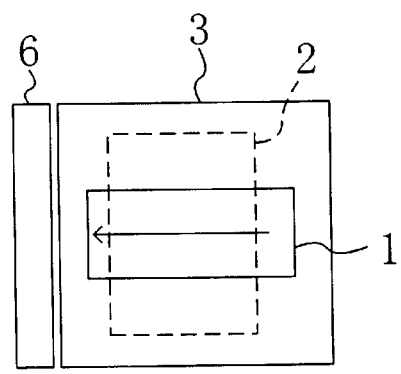
Figure 5C:
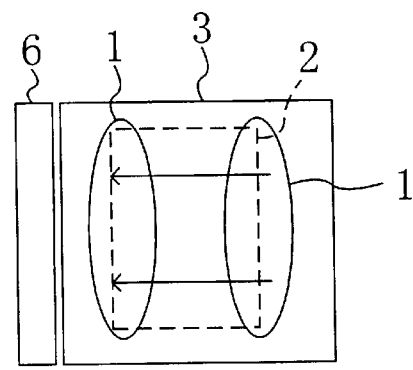

The exemplary locations of the n-type heavily doped region 1 shown in FIGS. 5B and 5C can further reduce the ON-state resistance. In the example shown in FIG. 5B, the n-type heavily doped region 1 extends from the drain contact region toward the gate electrode 6 in the direction in which the extended drain region 3 extends. The "drain contact region" herein means a region where the extended drain region 3 is in contact with the drain electrode 10. Optionally, the drain contact region may be an additional n-type heavily doped region provided separately from the n-type heavily doped region 1. In the drain region, the current flows smoothly from the drain contact region toward the channel region, resulting in a further reduced ON-state resistance. In the example shown in FIG. 5C, the n-type heavily doped regions 1 are provided to cover the regions where the current paths intersect the buried region 2. Accordingly, a p-type region 80 shown in FIG. 6B (described later) does not intersect the current paths. In the example shown in FIG. 5D, the n-type heavily doped region 1 entirely overlaps the p-type buried region 2. In such a case, the ON-state resistance can be further reduced. It should be noted that FIG. 1A illustrates the cross section of the device with the arrangement shown in FIG. 5D.

Figure 5D:
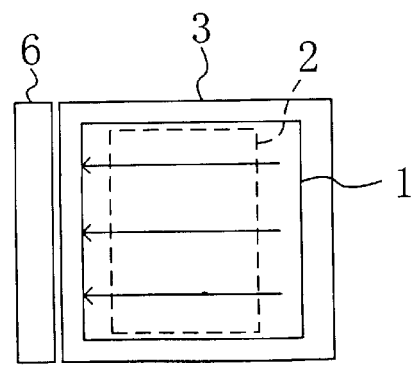

So long as the n-type heavily doped region 1 is formed in at least part of the region between the p-type buried region 2 and the surface of the substrate, the n-type heavily doped region 1 can contribute to the reduction of the ON-state resistance. However, the larger the area of the n-type heavily doped region 1 is, the lower the ON-state resistance can be. Accordingly, the layout shown in FIG. 5D is more suitable to the reduction of the ON-state resistance than the layouts shown in FIGS. 5A through 5C.

Hereinafter, the principal steps of the inventive fabrication process in which the p-type buried region 2 is formed by a high-energy ion implantation technique will be described in more detail with reference to FIGS. 6A, 6B, 6C, 6D and 6E.

Figure 6A:
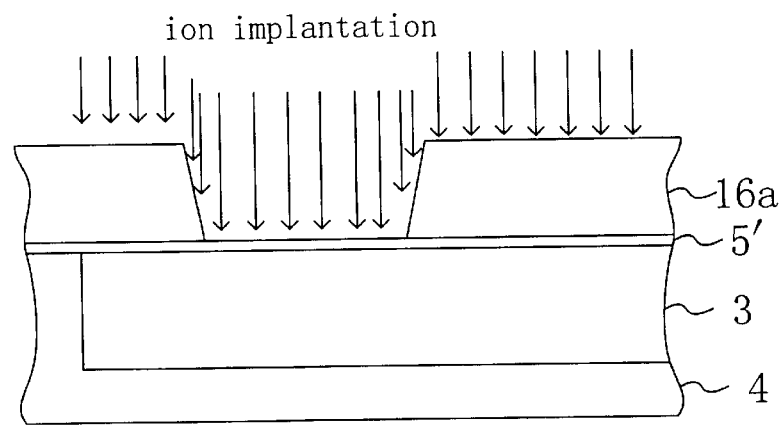
FIGS. 6A, 6B, 6C, 6D and 6E are cross-sectional views illustrating principal process steps of the first method according to the present invention where a p-type buried region is formed by a high-energy ion implantation technique.
Figure 6B:
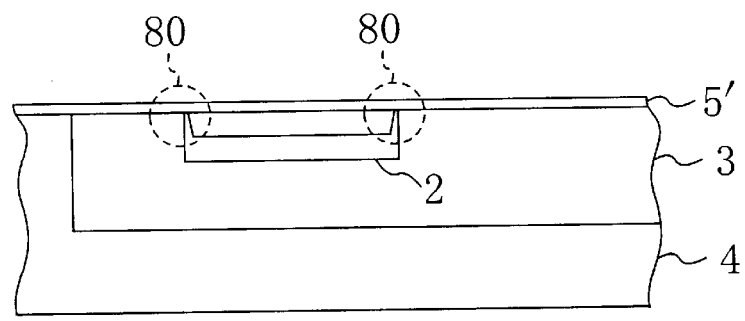
Figure 6C:
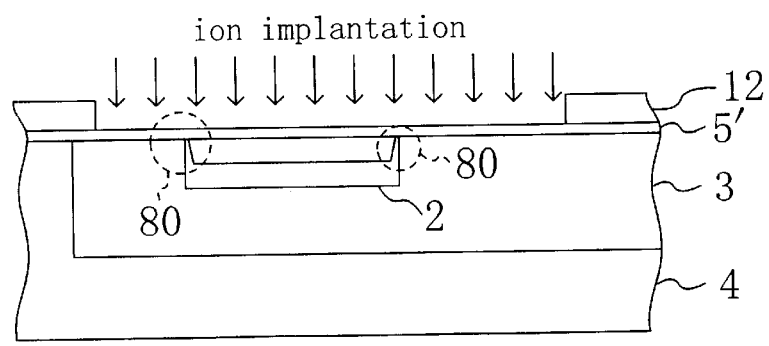

First, as shown in FIG. 6A, a particular region of the p-type silicon substrate 4 is doped with an n-type dopant, thereby forming the n-type extended drain region 3 in the silicon substrate 4. Next, an oxide film 5' is formed on the surface of the silicon substrate 4 and then the surface of the substrate 4 is covered with a thick resist film (thickness: from 3 $\mu$m to 5 $\mu$m) 16a by a photolithography technique. This thick resist film 16a has an opening defining the shape and location of the buried region to be formed. Then, boron ions are implanted through this opening into the silicon substrate 4 at a dose of about $1 \times 10^{13}$ cm$^{-2}$ to about $3 \times 10^{13}$ cm$^{-2}$ and with a high energy of 1 MeV to 2 MeV.

By employing this high-energy ion implantation technique, the boron ions implanted reach a depth of about 1 $\mu$m as measured from the surface of the extended drain region 3. Thereafter, to activate these boron ions, a heat treatment is conducted at a temperature from about 900° C. to about 1000° C., thereby forming the p-type buried region 2.

When a relatively thick resist film is formed to perform the high-energy ion implantation, the solvent and water contained in the resist film are vaporized in advance by heating to maintain a sufficient degree of vacuum within the ion implanter during the implantation process. However, since the resist film is deformed due to this pre-heating, the dopant ions penetrate part of the resist film during the ion implantation process. Accordingly, the p-type regions 80 are formed to cover the areas indicated by the dashed circles in FIG. 6B. If such p-type regions 80 are left to intersect the current paths, then the ON-state resistance cannot be reduced as expected.

Figure 6D:
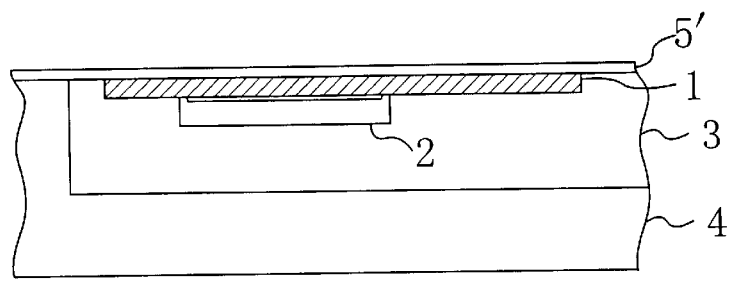

Subsequently, the surface of the substrate is covered with a resist film (thickness: about 1 $\mu$m to about 2 $\mu$m) 12 and then n-type dopant ions (e.g., phosphorus or arsenic ions) are implanted into the surface of the extended drain region 3, thereby changing the conductivity type of the surface region, including the p-type regions 80, into n-type. As a result, the p-type regions 80 disappear. In this process step, the implant dose is preferably defined at $1 \times 10^{13}$ cm$^{-2}$ or more and the implant energy is preferably selected within the range from about 30 keV to about 80 keV. If the ON-state resistance of the MOSFET should be further reduced, then an n-type dopant should be implanted at a higher dose into a wider surface area of the extended drain region 3 to increase the overall density of n-type carriers. FIG. 6D illustrates a state where the n-type heavily doped region 1 has been formed to overlap the p-type buried region 2.

Figure 6E:
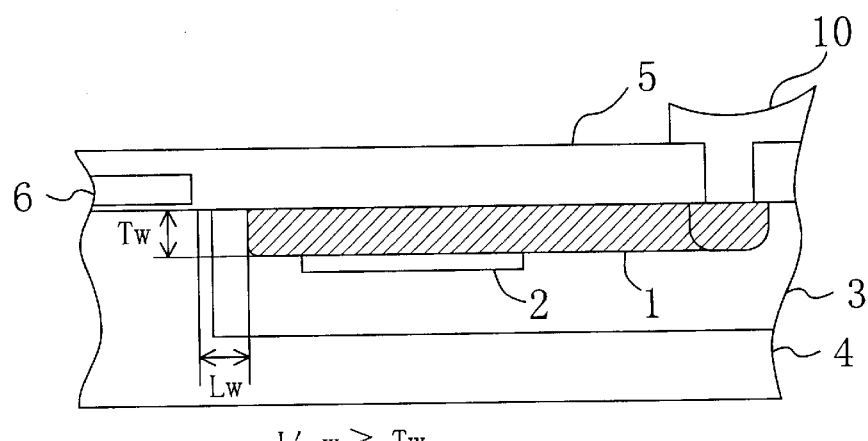

In FIG. 6E, a relatively thick n-type heavily doped region 1 has been formed so that the lower surface of the n-type heavily doped region 1 comes into contact with the upper surface of the p-type buried region 2. In other words, no lightly doped region exists between the n-type heavily doped region 1 and the p-type buried region 2 in the exemplary structure shown in FIG. 6E.

It should be noted that the n-type heavily doped region 1 may be formed by any technique other than ion implantation. Alternatively, the n-type heavily doped region 1 can be formed easily by applying or depositing a dopant source in the liquid or solid state onto the surface of the substrate. For example, a dopant may be diffused using a dopant source of $POCl_3$.

It should be noted that the n-type heavily doped region 1 is separated at a distance Lw from a point on the outer peripheral edge of the extended drain region 3 closer to the channel region. In order to increase the breakdown voltage by utilizing the depletion layers, the distance Lw should preferably be equal to or larger than the thickness Tw of the n-type heavily doped region 1 (i.e., Lw≧Tw).

EMBODIMENT 2

Figure 7A:
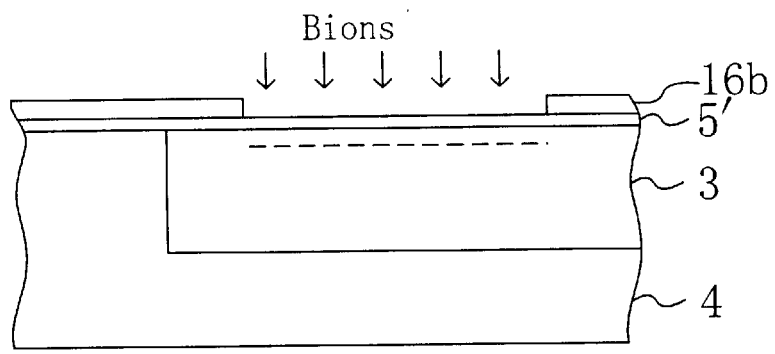
FIGS. 7A, 7B and 7C are cross-sectional views illustrating principal process steps of a second exemplary method according to the present invention where the p-type buried region is formed by a technique other than the high-energy ion implantation.

Hereinafter, an alternate embodiment of the method for fabricating a semiconductor device according to the present invention will be described with reference to FIGS. 7A, 7B and 7C. In this alternate embodiment, the p-type buried region 2 is formed by a technique other than the high-energy ion implantation. Accordingly, the adverse effects resulting from the deformation of the resist film during the high-energy ion implantation can be eliminated and complicated process steps are not required.

First, the extended drain region 3 is formed within the silicon substrate 4 by performing known fabrication process steps. Thereafter, as shown in FIG. 7A, the surface of the substrate 4 is covered with a resist film 16b and boron ions are implanted at a dose of about $1 \times 10^{13}$ cm$^{-2}$ to about $3 \times 10^{13}$ cm$^{-2}$ and with an implant energy of 30 keV to 80 keV. When the implant energy is defined at such a value, the impinging ions can be sufficiently blocked by the resist film 16b, even though the thickness of the resist film 16b is as small as about 1 μm to about 1.5 μm. Since the boron ions are implanted with such relatively low energy, the peak of profile of the implanted boron in the depth direction is located at a position closer to the surface of the substrate. As a result, the conductivity type of the n-type surface region of the substrate, which has been implanted with boron, is inverted into p-type.

Figure 7B:
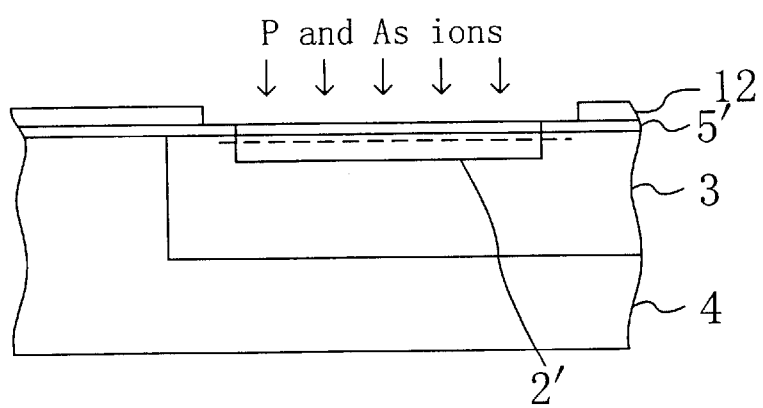
Figure 7C:
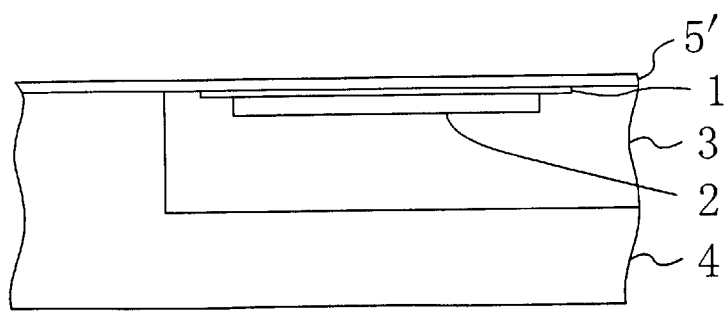

Next, as shown in FIG. 7B, the surface of the substrate 4 is covered with a resist film (thickness: about 1 μm to about 2 μm) 12, and then n-type dopant ions (e.g., phosphorus or arsenic ions) are implanted into the substrate 4 at a dose of $1 \times 10^{13}$ cm$^{-2}$ or more and with an implant energy of about 30 keV to about 50 keV. If the ON-state resistance of the MOSFET should be greatly reduced, the density of n-type carriers in the surface region of the substrate should be increased as a whole. In order to reduce the ON-state resistance of the MOSFET effectively, the n-type dopant ions should preferably be implanted into a wide area entirely overlapping the p-type buried region 2 as shown in FIG. 7B. FIG. 7C illustrates a state where the p-type region 2 has been buried by the formation of the n-type heavily doped region 1.

As in the first embodiment described above, the n-type heavily doped region 1 may be formed in the surface region by any technique other than the ion implantation. For example, the heavily doped region may be formed easily by applying or depositing a dopant source in the liquid or solid state.

In the foregoing first and second embodiments, a doped region such as the extended drain region is formed within a semiconductor substrate. However, the present invention is not limited to such specific embodiments in any way. For example, the respective doped layers may be formed within a semiconductor layer, which is either epitaxially grown on a semiconductor substrate or deposited on an insulating substrate.

It should be noted that the order, in which the above-described process steps of: doping a semiconductor layer with a dopant of a second conductivity type for an extended drain region; doping the semiconductor layer with a dopant of a first conductivity type for a buried region; and forming a heavily doped region of the second conductivity type at least between the surface of the semiconductor layer and the buried region by further doping the semiconductor layer with a dopant of the second conductivity type, is interchangeable.

EMBODIMENT 3

Figure 11A:
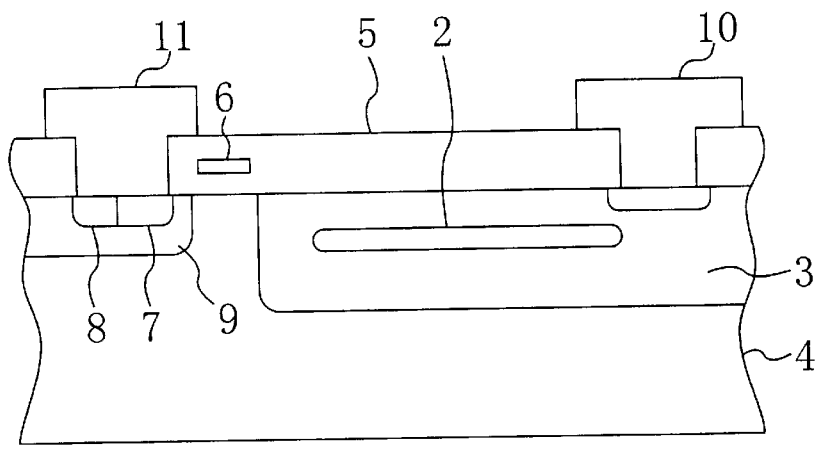
FIG. 11A is a cross-sectional view illustrating a modified embodiment of a semiconductor device according to the present invention taken along a plane parallel to the channel longitudinal direction thereof.
Figure 11B:
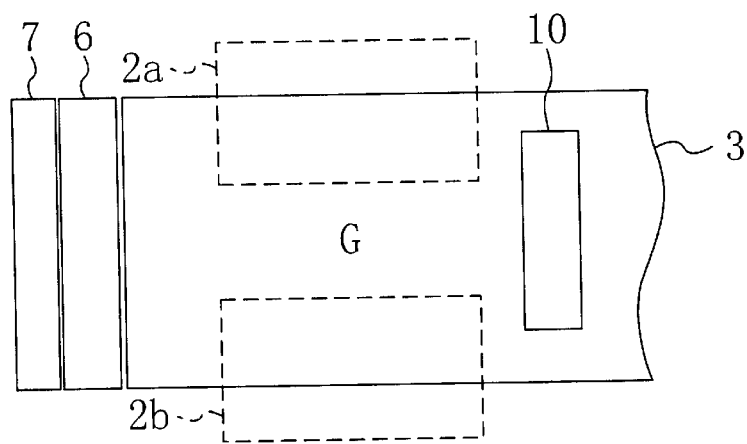
FIG. 11B is a plan view illustrating a planar layout thereof.

In the semiconductor device of the first and second embodiments, the p-type buried region 2 is in the form of a single continuous layer. Hereinafter, another exemplary semiconductor device including a modified p-type buried region 2 will be described. FIG. 11A illustrates a cross-sectional structure of a third embodiment of the semiconductor device taken along a plane parallel to the channel longitudinal direction thereof, and corresponds to FIG. 1A. FIG. 11B illustrates a planar layout of the device, and corresponds to FIG. 1B. And FIG. 11C is a cross-sectional view of the semiconductor device taken along a plane vertical to the channel longitudinal direction thereof.

The semiconductor device of the third embodiment is different from the semiconductor device shown in FIGS. 1A and 1B mainly in the configuration of the p-type buried region 2. Accordingly, only exemplary configurations of the p-type buried region 2 will be described in detail below, and the description of the other respects will be omitted herein.

As shown in FIG. 11B, the p-type buried region 2 is divided in this embodiment into a plurality of parts 2a and 2b. In this planar layout, the regions where the n-type extended drain region 3 does not overlap with the p-type buried region 2 are linked together within the n-type extended drain region 3. Accordingly, suppose a plane vertical to the principal surface of the substrate 4 exists to cross one edge of the n-type extended drain region 3, closer to the channel region, and the drain electrode 10 (such a plane will be referred to as a "virtual plane"). In the semiconductor device shown in FIGS. 1A and 1B, that virtual plane never fails to cross the p-type buried region 2 at right angles. In contrast, in the semiconductor device shown in FIGS. 11A, 11B and 11C, that plane may cross the gap region G between the parts 2a and 2b of the p-type buried region 2.

Figure 11C:
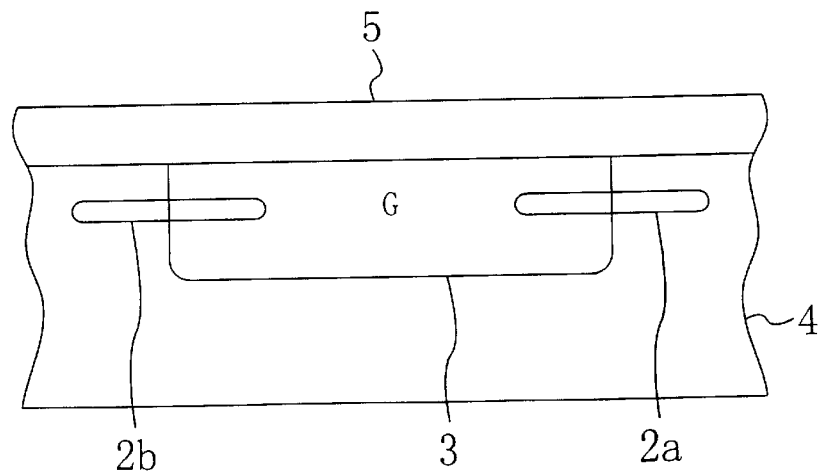
FIG. 11C is a cross-sectional view of the semiconductor device taken along a plane vertical to the channel longitudinal direction thereof.

In the semiconductor device shown in FIGS. 11A through 11C, no p-type buried region 2 exists in the gap region G. Accordingly, a sheet resistance in the gap region G is lower than that of the other regions of the n-type extended drain region 3, and the drain current can flow through this region G more easily.

To reduce the resistance of the n-type extended drain region 3 against the drain current while maintaining the intended function of the p-type buried region 2 to increase the breakdown voltage of the device, it is effective to provide the gap region G, which does not interrupt the drain current, by dividing the region 2 into a plurality of parts as shown in FIGS. 11B and 11C. If such a gap region G is provided, the ON-state current can be increased without providing the n-type heavily doped region 1 shown in FIGS. 1A and 1B, for example.

Figure 12A:
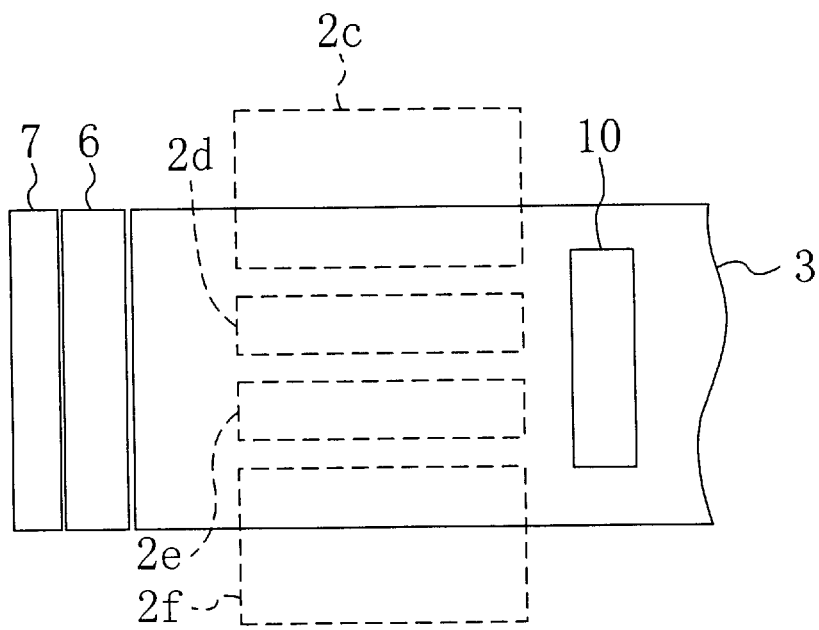
FIG. 12A is a plan view illustrating a planar layout for another embodiment of a semiconductor device according to the present invention.

FIG. 12A illustrates another exemplary planar layout for the semiconductor device according to the present invention. In the semiconductor device shown in FIG. 12A, the p-type buried region 2 is divided into four parts 2c, 2d, 2e and 2f, and three gap regions are formed in total between adjacent parts. Accordingly, since the drain current flows through these gap regions before anywhere else, the resistance of the n-type extended drain region 3 against the drain current can be further reduced.

Figure 12B:
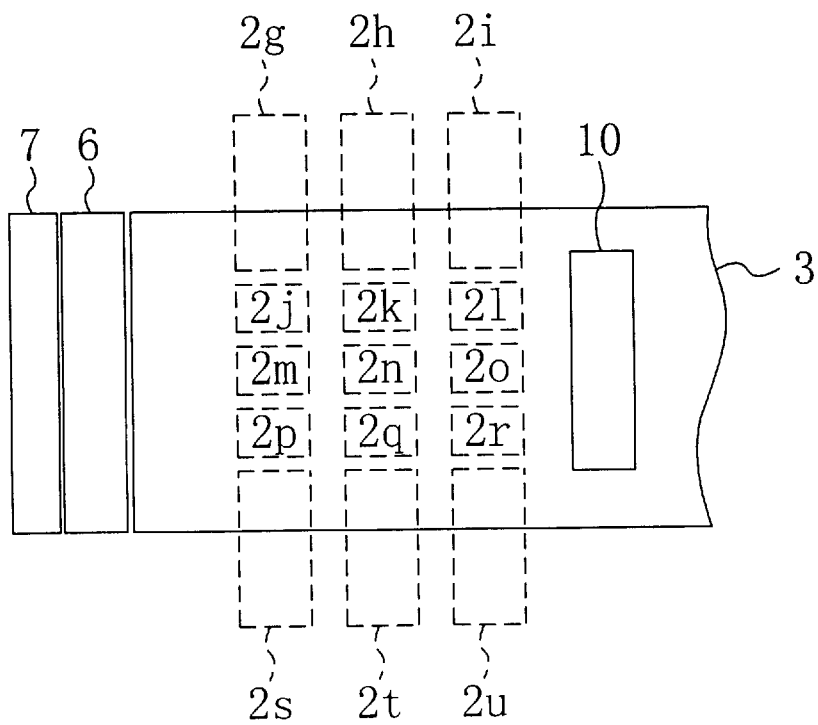
FIG. 12B is a plan view illustrating a planar layout for still another embodiment of a semiconductor device according to the present invention.

FIG. 12B illustrates still another exemplary planar layout for the semiconductor device according to the present invention. In the semiconductor device shown in FIG. 12B, the p-type buried region 2 is divided into fifteen parts 2g through 2u, and a multiplicity of gap regions are formed between adjacent parts.

As can be understood, the p-type buried region 2 may be divided in various manners to form an arbitrary pattern. However, the p-type buried region 2 should only be divided in such a manner that at least one drain current path is formed within part of the n-type extended drain region 3 where the p-type buried region 2 does not exist.

Such divided p-type buried regions 2 may be formed by providing a resist mask defining the planar layout of the p-type buried regions 2 by a known photolithography process and then by implanting p-type dopant ions for the p-type buried region 2 into the substrate 4.

The width of each gap region G may be selected within the range from about 1 $\mu$m to about 5 $\mu$m, and is variable with the pattern size of the resist mask and the conditions of the heat treatment conducted after the implantation of the dopant ions. If this heat treatment is conducted at a high temperature for a long time, then the width of each gap region G decreases because the dopant diffuses laterally over a noticeable distance. Thus, the fabrication conditions should be controlled at the final stage thereof such that the width of each gap region G has a finite value, not zero.

Figure 13A:
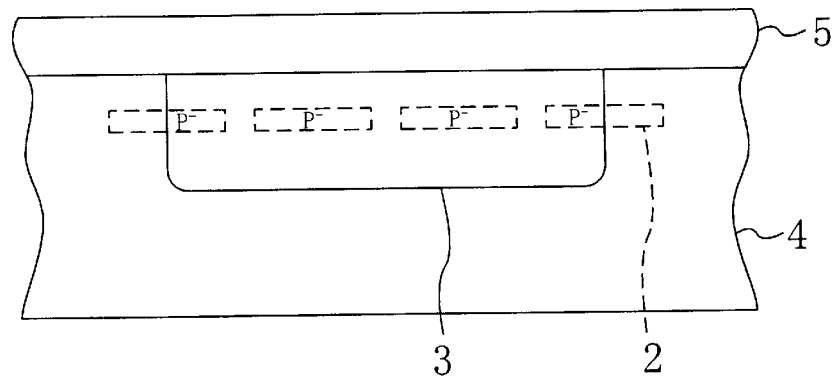
FIG. 13A is a cross-sectional view of the semiconductor device shown in FIG. 12A and taken along a plane vertical to the channel longitudinal direction thereof.

FIG. 13A illustrates a cross section of the device shown in FIG. 12A, which is taken vertically to the channel longitudinal direction. As can be seen from FIG. 13A, no n-type heavily doped region 1 is provided between the surface of the semiconductor substrate 4 and the p-type buried regions 2 in this example. However, the drain current flows through the regions where the p-type buried regions 2 do not exist (i.e., gap regions) before anywhere else, thus decreasing the ON-state resistance. To further reduce the ON-state resistance, however, the n-type heavily doped region 1 is preferably provided between the surface of the semiconductor substrate 4 and the p-type buried regions 2.

Figure 13B:
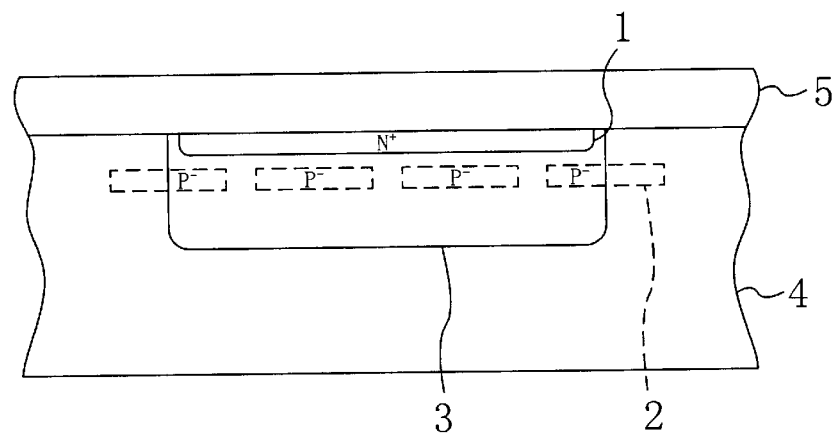
FIG. 13B is a cross-sectional view in which an n-type heavily doped region 1 is provided for the device shown in FIG. 13A.
Figure 13C:
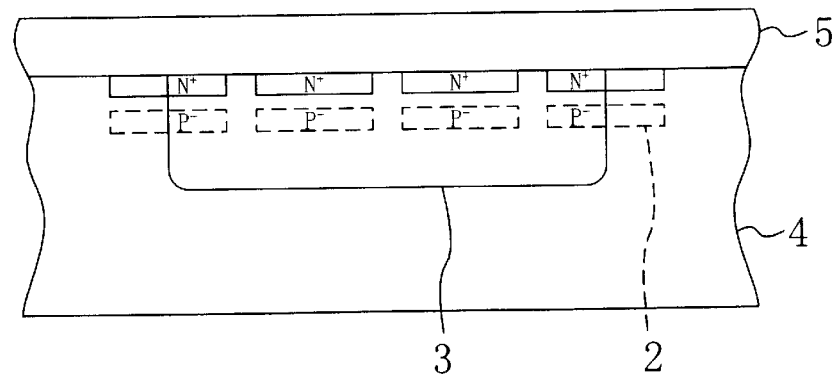
FIG. 13C is a cross-sectional view in which a plurality of divided n-type heavily doped regions 1 are provided between a plurality of p-type buried regions 2 and the surface of the semiconductor substrate 4 to have the same pattern as that of the p-type buried regions 2.

In the arrangement shown in FIG. 13B, the n-type heavily doped region 1 such as that shown in FIGS. 1A and 1B is formed over the p-type buried regions 2. In the arrangement shown in FIG. 13C, a plurality of n-type heavily doped regions 1 are formed between a plurality of p-type buried regions 2 and the surface of the semiconductor substrate 4 so as to have a similar pattern to that of the p-type buried regions 2. In forming such n-type heavily doped regions 1, it is more efficient to use the same resist mask as that used for forming the p-type buried regions 2.

It should be noted that the n-type heavily doped region(s) 1 may be formed to come into contact with the upper surface of the p-type buried regions 2.

By dividing the p-type buried region 2 into a plurality of parts and providing the n-type heavily doped region 1 near the surface of the drain region in this manner, the ON-state resistance can be further reduced advantageously.

In a semiconductor device according to the present invention, a heavily doped region is provided between a buried region, at least part of which is included in an extended drain region, and the surface of a semiconductor substrate. The heavily doped region contains a dopant of a second conductivity type at a concentration higher than that in the extended drain region. Accordingly, the ON-state resistance of the semiconductor device can be reduced and the variation in resistance thereof can be greatly suppressed.

A method for fabricating a semiconductor device according to the present invention includes the steps of: doping a semiconductor layer with a dopant of a second conductivity type for an extended drain region; doping the semiconductor layer with a dopant of a first conductivity type for a buried region; and forming a heavily doped region of the second conductivity type at least between the surface of the semiconductor layer and the buried region by further doping the semiconductor layer with the dopant of the second conductivity type. Thus, the heavily doped region with a low resistance can be formed between the buried region and the surface of the semiconductor layer with satisfactorily high precision and reproducibility.

In another semiconductor device according to the present invention, a buried region, at least part of which is included within an extended drain region, is divided into a plurality of parts. Accordingly, the ON-state resistance of the semiconductor device can be low with a sufficiently high breakdown voltage maintained.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor device comprising:
    a semiconductor substrate of a first conductivity type;
    a source region of a second conductivity type, the source region being formed in the semiconductor substrate;
    a drain region of the second conductivity type, the drain region being formed in the semiconductor substrate;
    a channel region provided between the source and drain regions; and
    a gate electrode formed over the channel region,
    wherein the device further comprises:
        a buried region of the first conductivity type, at least part of the buried region being included in the drain region;
        a heavily doped region of the second conductivity type, the heavily doped region being provided in the inner part of the drain region, and at least between a surface of the semiconductor substrate and the buried region, the concentration of a dopant of the second conductivity type in the heavy doped region being higher than that of the dopant of the second conductivity type in the drain region; and
        a doped region of the first conductivity type, which is formed around the drain region,
    wherein the buried region of the first conductivity type is connected to the doped region of the first conductivity type, and wherein part of the heavily doped region is in contact with a drain electrode.

2. The device of claim 1, wherein the concentration of a dopant of the first conductivity type in the doped region of the first conductivity type is higher than that of the dopant of the first conductivity type in the semiconductor substrate.

3. The device of claim 1, wherein the heavily doped region is formed to cover the outer periphery of the buried region.

4. The device of claim 1, wherein the heavily doped region is formed to cover at least part of an outer peripheral portion of the buried region extending in the direction in which the drain region extends.

5. The device of claim 1, wherein the heavily doped region is formed to substantially cover the buried region.

6. The device of claim 1, wherein the heavily doped region is in contact with the buried region.

7. The device of claim 1, wherein the thickness of the heavily doped region is 0.5 $\mu$m or more.

8. The device of claim 1, wherein the heavily doped region includes a part in which the concentration of a dopant of the second conductivity type is $1 \times 10^{17}$ cm$^{-3}$ or more.

9. The device of claim 1, further comprising means for applying a reverse bias to between the buried region and the drain region during an operation of the device.

10. The device of claim 1, wherein an active region, including the source, channel and drain regions, is surrounded by an isolating region, and wherein a doped region of the first conductivity type is formed within the isolating region, and wherein at least part of the doped region of the first conductivity type is electrically in contact with the buried region.

11. The device of claim 1, wherein the heavily doped region is separated from an outer peripheral edge of the drain region at a distance, the edge being adjacent to the channel region.

12. The device of claim 11, wherein the distance is equal to or larger than the thickness of the heavily doped region.

13. A semiconductor device comprising:

a semiconductor substrate of a first conductivity type;

a source region of a second conductivity type, the source region being formed in the semiconductor substrate;

a drain region of the second conductivity type, the drain region being formed in the semiconductor substrate;

a channel region provided between the source and drain regions; and a gate electrode formed over the channel region, wherein the device further comprises:

a buried region of the first conductivity type, at least part of the buried region being included in the drain region, the buried region being divided into a plurality of parts; and a doped region of the first conductivity type, which is formed around the drain region, wherein the buried region of the first conductivity type is connected to the doped region of the first conductivity type, and wherein the buried region of the first conductivity type is divided into pads in the drain region, and a gap region for making a drain current flow there through exists between adjacent ones of the divided parts of the buried region of the first conductivity type.

14. The device of claim 13, wherein the number of the parts of the buried region is three or more.

15. The device of claim 13, further comprising a heavily doped region of the second conductivity type, the heavily doped region being provided at least between a surface of the semiconductor substrate and the buried region, the concentration of a dopant of the second conductivity type in the heavily doped region being higher than that of the dopant of the second conductivity type in the drain region.

16. The device of claim 15, wherein part of the heavily doped region is in contact with a drain electrode.

17. The device of claim 13, further comprising a doped region of the first conductivity type, which is formed around the drain region, wherein the concentration of a dopant of the first conductivity type in the doped region of the first conductivity type is higher than that of the dopant of the first conductivity type in the semiconductor substrate.

18. The device of claim 15, wherein the heavily doped region includes a portion extending from over first to second outer peripheral parts of the buried region, the first outer peripheral part being closer to a drain contact region than the second outer peripheral part.

19. The device of claim 15, wherein the heavily doped region is formed to cover the outer periphery of the buried region.

20. The device of claim 15, wherein the heavily doped region is formed to cover at least part of an outer peripheral portion of the buried region extending in the direction in which the drain region extends.

21. The device of claim 15, wherein the heavily doped region is formed to substantially cover the buried region.

22. The device of claim 15, wherein the heavily doped region is in contact with the buried region.

23. The device of claim 15, wherein the thickness of the heavily doped region is 0.5 $\mu$m or more.

24. The device of claim 15, wherein the heavily doped region includes a part in which the concentration of a dopant of the second conductivity type is $1 \times 10^{17}$ cm$^{-3}$ or more.

25. The device of claim 13, further comprising means for applying a reverse bias to between the buried region and the drain region during an operation of the device.

26. The device of claim 15, wherein an active region, including the source, channel and drain regions, is surrounded by an isolating region, and wherein a doped region of the first conductivity type is formed within the isolating region, and wherein at least part of the doped region of the first conductivity type is electrically in contact with the buried region.

27. The device of claim 15, wherein the heavily doped region is separated from an outer peripheral edge of the drain region at a distance, the edge being adjacent to the channel region.

28. The device of claim 27, wherein the distance is equal to or larger than the thickness of the heavily doped region.

29. The device of claim 24, wherein the lower surface of the heavily doped region is in contact with the upper surface of the buried region.

30. The device of claim 24, wherein the semiconductor substrate is a single crystalline semiconductor substrate.

* * * * *